United States Patent [19]

Nakamura

[11] 4,105,999
[45] Aug. 8, 1978

[54] PARALLEL-PROCESSING ERROR CORRECTION SYSTEM

[75] Inventor: Katsuhiro Nakamura, Tokyo, Japan

[73] Assignee: Nippon Electric Co., Ltd., Tokyo, Japan

[21] Appl. No.: 756,923

[22] Filed: Jan. 4, 1977

[30] Foreign Application Priority Data

Jan. 12, 1976 [JP] Japan ............................... 51-2586

[51] Int. Cl.² ............................................. G06F 11/12
[52] U.S. Cl. .................. 340/146.1 AL; 340/146.1 BE
[58] Field of Search ............. 340/146.1 BE, 146.1 AL

[56] References Cited

U.S. PATENT DOCUMENTS

| 3,452,328 | 6/1969 | Hsiao et al. | 340/146.1 AL |
| 3,465,287 | 9/1969 | Kennedy et al. | 340/146.1 BE |
| 3,601,800 | 9/1969 | Lee | 340/146.1 BE |
| 3,622,985 | 11/1971 | Ayling et al. | 340/146.1 BE |
| 3,703,705 | 12/1970 | Patel | 340/146.1 AL |

OTHER PUBLICATIONS

Boudreau et al., Parallel CRC Generation for Multilength Characters, IBM Technical Disclosure Bulletin, vol. 15, No. 4, Sep. 1972, pp. 1314–1315.

Primary Examiner—Charles E. Atkinson
Attorney, Agent, or Firm—Sughrue, Rothwell, Mion, Zinn and Macpeak

[57] ABSTRACT

A parallel-processing error correction system for digital data transmission employing a code-polynomial division circuit having a serial-type shift register for a cyclic code. Provided with null input lines, one for each data input line, a set of switches for selection between the data and null input lines, and another set of switches associated with buffer registers for series connection therebetween, the device can be readily adapted for any change in number of parallel input bits by switch operation.

6 Claims, 3 Drawing Figures

BIT PATTERN DETECTOR

PARALLEL-PROCESSING ERROR CORRECTION SYSTEM

BACKGROUND OF THE INVENTION

This invention relates to a system adapted for the automatic detection and correction of errors occurring in digital data transmission or storage and more particularly to the system of the type designed to operate upon a data bit train (sequence) received in parallel for the error detection and correction.

The principles of error detection and correction will now be explained conveniently in connection with data transmission.

As is known in the art, most of errors occurring in the data transmission are caused by the noise on the transmission channel. In order to avoid the adverse effects of noise, conventional error detection and/or correction systems have been employed in which, at the transmitter, a train of information bits is sent out onto the transmission channel, together with a train of redundant bits and, at the receiver, the received bit train is decoded on the basis of the redundancy of the code formation.

A well-known method of adding the train of the redundant bits is to employ a cyclic error-correcting code such as that described by SHU Lin in the book titled, *An Introduction to Error Correcting Codes*, pp. 70–77, published in 1970 by Prentice-Hall, Inc., Englewood Cliffs, N.J.

To describe this method briefly, a train of redundant bits $a_{k+1}, a_{k+2}, \ldots, a_{k+m}$ to be added to a train of information bits $a_1, a_2, \ldots, a_k$ is determined as follows: Namely, a polynomial $I(x) = a_1 x^{N-1} + a_2 x^{N-2} + \ldots + a_k x^{N-k}$, which corresponds to the information bit train, $N(=k+m)$ representing the code length or the combined length of the two (information and redundant) bit trains, is divided by a predetermined generator polynomial of degree $m$, $g(x) = x^m + g_1 x^{m-1} + \ldots + g_{m-1} x + 1$ to obtain a remainder polynomial $R(x) = r_1 x^{m-1} + r_2 x^{m-2} + \ldots + r_{m-1} x + r_m$. Then, the redundant bits $a_{k+1}, a_{k+2}, \ldots, a_{k+m}$ are determined as the coefficients of the remainder polynomial $r_1, r_2, \ldots, r_m$, respectively. It is to be noted that a code polynomial $A(x) = a_1 x^{N-1} + a_2 x^{N-2} + \ldots a_{N-1} x + a_N$ representing a combination of the trains, of the information bits and the redundant bits determined in the manner described above is at all times divisible by the generator polynomial $g(x)$ of degree $m$.

On the other hand, at the receiver, the code formed in the manner described above is received, and the polynomial $A(x)$ representing the received code is divided by the generator polynomial $g(x)$ for error detection. As a result, it is decided that the received code is correct when there is no remainder produced in the division and that in error when there is given any remainder. The received bit or bits to be corrected are then identified depending on the bit pattern of the remainder and properly corrected. The decoder or the processing circuit used for this purpose is comprised of a feedback shift register for effecting the division by $g(x)$, a bit-pattern detector and a buffer memory so as to normally operate upon the received code serially by bits. Such a serial processing circuit, however, must be converted into one for use with parallel data in case where the data should be dealt with in groups of eight bits, i.e., in characters, or at speed slower than the serial data speed.

A decoder designed to operate in parallel upon a cyclic error-correcting code and already put into practical use is seen in the U.S. Pat. No. 3,452,328, which describes the device including a parallel-input parallel-feedback type shift register 16 (FIG. 1), a detector 18 for detecting a number of bit patterns, and a buffer memory 12 for storing received data. In the shift register 16, the pattern of feedback connections is determined depending on the number $u$ of parallel input lines, and the generator polynomial $g(x)$. In other words, the feedback connections are made so that the contents in the shift register 16 after the supply of one clock pulse represent the result obtained upon operation of the corresponding serial processing circuit in a period of $u$ consecutive clocks.

As a disadvantage of this decoder, the increase of the number of parallel input bits or the complicated structure of the generator polynomial invites the increase of the number of gates included between individual registers in the shift register 16, and, in some cases, this makes it difficult to attain any desired reduction in processing speed, which is one of the major objects of parallelization.

Generally, in the case where reduction in the data transmission speed is required due to deterioration in performance of the transmission line, it is desirable to change the number of parallel input bits at the receiver so that the operating clock for the decoder (the whole structure shown in FIG. 1 of the U.S. Pat. No. 3,452,328) may remain unchanged. In such a case, however, it will be apparent that the parallel-processing system of the U.S. Pat. No. 3,452,328 cannot be utilized as it stands. Therefore, there arises the need for remodelling the network according to the change required in the number of parallel input bits. Thus, the system of the U.S. patent lacks the adaptability.

SUMMARY OF THE INVENTION

An object of this present invention is to provide a novel error correction system for a parallel data transmission system free of the previously encountered difficulties as described above.

The present error correction system receiving an enclodEd message added with redundant bits and operating for error correction comprises a plurality of input lines, a plurality of serial buffer registers associated with the input lines to store a train of bits fed in parallel therethrough, a combination logic circuit arranged to convert said train of bits into bit patterns of a length determined depending on the number of the redundant bits, a code-polynomial division circuit employing a parallel-input serial-feedback shift register to be fed with said bit patterns as an input thereto, a bit-pattern detector to detect particular bit patterns in the output of the division circuit and an error-correcting circuit operable to correct bit trains read out in parallel from the buffer registers in response to the output from the detector.

Furthermore, the present system is characterized in that it further comprises a plurality of null input lines provided one for each of the data input lines, a plurality of first switches each operable to selectively connect either one of input lines or one of the null input lines to the combination logic circuit and a plurality of second switches each operable to selectively connect either one of the input lines selected by the first switches or one of the output lines of the buffer registers to one of the buffer registers next to the buffer register whose output line is selected.

With this circuit arrangement, the present error correction system can operate effectively even where the number of parallel input bits, that is, of data input lines is changed, simply by the operation of the first and second switches depending on the change in the number of parallel input bits.

The above and other objects, features and advantages of the present invention will become apparent from the following detailed description in conjunction with the accompanying drawings.

DESCRIPTION OF THE PREFERRED EMBODIMENT

Figure 1:
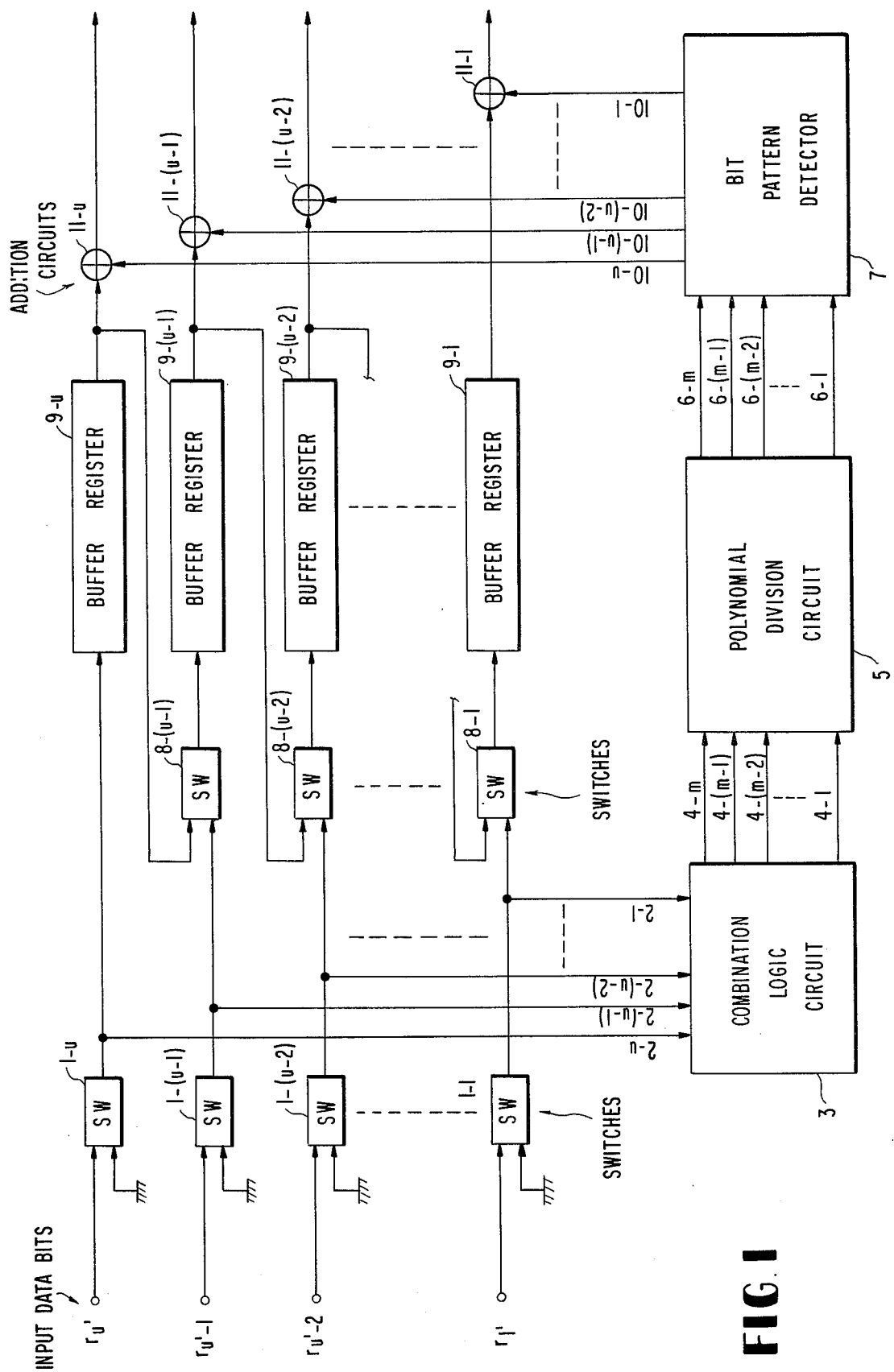
FIG. 1 shows a block diagram of one preferred embodiment of the present invention.

In FIG. 1 which illustrates the present system principally designed to correct a single random error in N bits.

As stated hereinbefore, the received N-bit code is fed to the present system at a section unit consisting of $u$ bits. If N is not a multiple of $u$, the code includes $d$ bits of "0" at its head as dummy bits, $d$ being an integer smaller than $u$, which renders the total number $N+d$ of bits in the code divisible by $u$ without any remainder. In FIG. 1, reference letters $r_1'$, $r_2'$, ... and $r_u'$ represent a set of input data bits for each code section of $u$ bits. A plurality of first switches 1-1 - 1-$u$ are provided to select one of data input lines or the earth line (i.e., the null input line and, during the period of data reception, each switch is held in a position connected with the associated data input line. Also, a plurality of second switches 8-1 - 8-($u$-1) are provided to select one of outputs from buffer registers 9-2 - 9-$u$ or one of the input lines selected by the respective first switches 1-1 - 1-($u$-1). Assuming now that $u$-bit parallel processing is performed, the second switches 8-1 - 8-($u$-1) are held in connection with the respective input lines selected by the first switches 1-1 - 1-($u$-1). As will readily be noted, the buffer registers 9-1 - 9-$u$ store data bits successively and are each formed in a length to store $(N+d)/u$ bits.

Now, input data bits given through the switches 1-1 - 1-$u$ and 8-1 - 8-($u$-1) are fed through lines 2-1 - 2-$u$ to a combination logic circuit 3 while at the same time they are stored successively in the shift registers 9-1 - 9-$u$. The construction of the logic circuit 3 will be described below with reference to FIG. 2.

Figure 2:
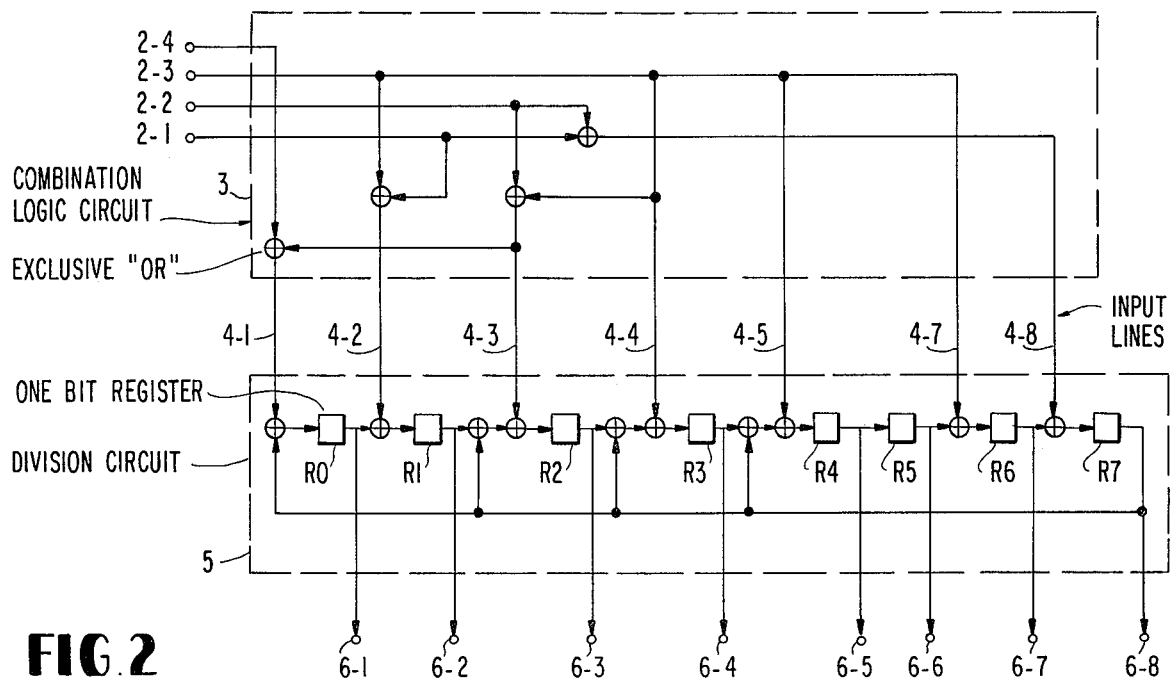
FIG. 2 shows a diagram of a combination logic circuit and a code-polynomial division circuit of FIG. 1 in detail.

In FIG. 2, the logic circuit 3 is designed for 4-bit parallel processing of a cyclic code whose generator polynomial $g(x)$ is $x^8 + x^4 + x^3 + x^2 + 1$. In this case, it is to be noted that the number of redundant bits in the code is $m=8$; the code length, $N = 2^8 - 1 = 255$; the number of the information bits, $k = 255 - 8 = 247$; the number of parallel input bits, $u=4$; the number of dummy bits, $d=1$; and the length of each of the buffer registers, $(255+1)/4 = 64$.

Now, the combination logic circuit 3 of FIG. 2 is arranged as a circuit calculating the remainder obtained when the polynomial $r_1'(x^{64})^3 + r_2'(x^{64})^3 + r_3'x^{64} + r_4'$ is divided by the generator polynomial $g(x) = x^8 + x^4 + x^3 + x^2 + 1$. The exponent 64 in the divided polynomial is the reciprocal of the number of parallel input bits, $u=4$ for modulo $N=255$; that is $4 \times 64 = 1 \pmod{255}$. The remainder in this case is actually calculated as $(r'_1 \oplus r'_2)x^7 + r'_3x^6 + 0 \cdot x^5 + r'_3x^4 + r'_3x^3 + (r'_2 \oplus r'_3)x^2 + (r'_1 \oplus r'_3)x + (r'_2 \oplus r'_3 \oplus r'_4)$, where $\oplus$ represents modulo 2 summation.

Accordingly, the combination logic circuit 3 of FIG. 2 is constructed with modulo 2 addition circuits or EOR circuits (exclusive or circuits) $\oplus$ arranged for a combination of the input lines 2-1 - 2-4 in a manner so as to give (2-2) $\oplus$ (2-3) $\oplus$ (2-4), (2-1) $\oplus$ (2-3), (2-2) $\oplus$ (2-3), (2-3), null input, (2-3) and (2-1) $\oplus$ (2-2) onto respective output lines 4-1 - 4-5, 4-7 and 4-8.

To state in general terms, the logic circuit 3 shown in FIG. 1 is a circuit arranged to calculate a train of the coefficient bits of a remainder polynomial $C(x) = C_0 + C_1x + \ldots + C_{m-1}x^{m-1}$ obtained when the polynomial corresponding to the input data bits $r'_1, r'_2, \ldots$ and $r'_u$ and expressed in the form of $r'_1(x^{u*})^{u-1} + r'_2(x^{u*})^{u-2} + \ldots + r'_{u-1}x^{u*} + r'_u$, where $u \cdot u^* = 1 \pmod{N}$, is divided by the generator polynomial $g(x)$ of degree $m$ of the cyclic code.

Now, the train of the coefficients $C_1, C_2, \ldots$ and $C_m$ obtained at the combination logic circuit 3 are fed through the respective output lines 4-1 - 4-m to a code-polynomial division circuit 5, which is of the ordinary serial type formation, including $m$ stages of a shift register with the feedback connections determined by a generator polynomial $g(x)$.

The construction of this division circuit 5 will be described below in more detail with reference to FIG. 2.

In FIG. 2, reference numeral 5 indicates a division circuit of the generator polynomial $g(x)$, which in this case is $x^8 + x^4 + x^3 + x^2 + 1$, as described above, and includes one-bit registers $R_0$ - $R_7$ connected as shown with shift lines, feedback lines determined by $g(x)$, and the input lines 4-1 - 4-5, 4-7 and 4-8. It is to be noted that the input line 4-6 is omitted because in this case, it is always held at null input, as described hereinbefore.

Description will next be made of the operation of the code-polynomial division circuit 5 of FIG. 2. Data bits $b_0, b_1, \ldots$ and $b_7$ stored in the respective registers $R_0$ - $R_7$ are related to the corresponding polynomial $B(x) = b_0 + b_1x + b_2x^2 + \ldots + b_7x^6$. Similarly, data bits $C_0, C_1, \ldots$ and $C_7$ ($C_5 = 0$) fed through the input lines 4-1 - 4-8 are related to the corresponding polynomial $C(x) = C_0 + C_1x + \ldots + C_7x^6$. It is to be noted that, upon each one-clock operation of this division circuit, the coefficients $l_0, l_1, \ldots$ and $l_7$ of the remainder polynomial $l(x) = l_0 + l_1x + \ldots + l_7x^7$ by dividing the polynomial $B(x) \cdot x^{4 \cdot 64} + Cx$ by the generator polynomial $g(x) = x^8 + x^4 + x^3 + x^2 + 1$ are stored in the respective registers $R_0$ - $R_7$.

Now suppose, for example, that the data initially stored in the respective registers $R_0$ - $R_7$ are 1, 0, 0, 0, 1, 0, 0, 1, and that the input data $C_0, C_1, \ldots, C_7$ are 1, 0, 0, 0, 0, 1, 1, 1, respectively. Then, upon one clock operation, the contents of the registers $R_0$ - $R_7$ are changed to 1, 0, 1, 1, 0, 1, 1, 0, respectively. The new contents correspond to the coefficients of the remainder polynomial $1 + 0 \cdot x^2 + 1 \cdot x^3 + 0 \cdot x^4 + 1 \cdot x^5 + 1 \cdot x^6 + 0 \cdot x^7$ obtained when the polynomial $(1 + 0 \cdot x + 0 \cdot x^2 + 0 \cdot x^3 + 1 \cdot x^4 + 0 \cdot x^5 + 0 \cdot x^6 + 1 \cdot x^7) \cdot x^{256} + (1 + 0 \cdot x + 0 \cdot x^2 + 0 \cdot x^3 + 0 \cdot x^4 + 1 \cdot x^5 + 1 \cdot x^6 + 1 \cdot x^7)$ is divided by the generator polynomial $g(x) = x^8 + x^4 + x^3 + x^2 + 1$.

As apparent from the foregoing, in this system, received data bits 0, 0, ..., 0, $r_1, r_2, \ldots$ and $r_N$ (0 represents $d$ dummy bits) are fed at a section unit of $u$ bits, and they are stored in the buffer registers 9-1 – 9-u while at the same time division is performed at the division circuit 5 upon the data given through the combination logic circuit 3. As soon as such as operation has been finished completely in the period of $(N+d)/u$ clocks, the switches 1-1 – 1-u are all transferred to the side of the null input lines. At this time point, all the data bits received in groups of $u$ bits are already stored in the buffer registers 9-1 –9-u. Also, stored in the division circuit 5 is a train of the coefficient bits of the remainder polynomial obtained by dividing $(r_1x^{N-1} + r_2x^{N-2} + \ldots + r_{N-1}x + r_N)^{u^*}$ by $g(x)$, where $u \cdot u^* = 1 \pmod{N}$.

Description will next be made of this operation specifically with reference to FIG. 2.

In the event that, at the first clock, data bits 1, 0, 1, 1 are fed through the lines 2-1 – 2-4, the registers $R_0 - R_7$ in the division circuit 5 are supplied through the combination logic circuit 3 with data bits 0, 0, 1, 1, 1, 0, 1, 1 equal to the respective coefficients of the remainder polynomial $0 + 0 \cdot x + 1 \cdot x^2 + 1 \cdot x^3 + 1 \cdot x^4 + 0 \cdot x^5 + 1 \cdot x^6 + 1 \cdot x^7$. This remainder polynomial is obtained by dividing $1 \cdot (x^{64})^3 + 0 \cdot (x^{64})^2 + 1 \cdot (x^{64}) + 1$ by $g(x) = x^8 + x^4 + x^3 + x^2 + 1$, since $4 \times 64 = 1 \pmod{255}$.

Next, when, at the second clock, data bits 1, 1, 0, 1 are fed through the lines 2-1 – 2-4, the division circuit 5 will be fed fed with a bit pattern 0, 1, 1, 0, 0, 0, 0, 0 corresponding to the coefficients of the remainder polynomial $0 + 1 \cdot x + 1 \cdot x^2 + 0 \cdot x^3 + 0 \cdot x^4 + 0 \cdot x^5 + 0 \cdot x^6 + 0 \cdot x^7$. This remainder polynomial is obtained when $1 \cdot (x^{64})^3 + 1 \cdot (x^{64})^2 + 0 \cdot x^{64} + 1$ is divided by $g(x) = x^8 + x^4 + x^3 + x^2 + 1$. In this way, in response to one clock operation of the division circuit 5, a bit pattern 1, 1, 0, 0, 0, 1, 0, 1 corresponding to a set of the coefficients of the remainder polynomial $1 + 1 \cdot x + 0 \cdot x^2 + 0 \cdot x^3 + 0 \cdot x^4 + 1 \cdot x^5 + 0 \cdot x^6 + 1 \cdot x^7$ are stored in the registers $R_0 - R_7$. This remainder polynomial is made in the division by $g(x) = x^8 + x^4 + x^3 + x^2 + 1$ of the remainder polynomial $(1 \cdot (x^{64})^3 + 1 \cdot (x^{64})^2 + 1 \cdot (x^{64}) + 1) \cdot x^{256} + (1 \cdot (x^{64})^3 + 1 \cdot (x^{64})^2 + 0 \cdot x^{64} + 1)$, which is obtained when $(0 + 0 \cdot x + 1 \cdot x^2 + 1 \cdot x^3 + 1 \cdot x^4 + 0 \cdot x^5 + 1 \cdot x^6 + 1 \cdot x^7)x^{256} + (0 + 1 \cdot x + 1 \cdot x^2 + 0 \cdot x^3 + 0 \cdot x^4 + 0 \cdot x^5 + 0 \cdot x^6 + 0 \cdot x^7)$ is divided by $g(x) = x^8 + x^4 + x^3 + x^2 + 1$.

It is noted at this point that, since 256 is equal to $4 \times 64$ and $x^{256}$ is equal to $(x^{64})^3$, the remainder polynomial finally obtained, i.e., $1 + 1 \cdot x + 0 \cdot x^2 + 0 \cdot x^3 + 0 \cdot x^4 + 1 \cdot x^5 + 0 \cdot x^6 + 1 \cdot x^7$ is equal to the remainder polynomial obtained by the division of $(1 \cdot (x^{64})^7 + 0 \cdot (x^{64})^6 + 1 \cdot (x^{64})^5 + 1 \cdot (x^{64})^4)$ 30 $(1 \cdot (x^{64})^3 + 1 \cdot (x^{64})^2 + 0 \cdot x^{64} + 1)$ by $g(x) = x^8 + x^4 + x^3 + x^2 + 1$. Also, as will readily be seen from a calculation made with regard to $1 \oplus 1 = 0$, the following equation is held: $1 \cdot (x^{64})^7 + 0 \cdot (x^{64})^6 + 1 \cdot (x^{64})^5 + 1 \cdot (x^{64})^4 + 1 \cdot (x^{64})^3 + 1 \cdot (x^{64})^2 + 0 \cdot x^{64} + 1 = (1 \cdot x^7 + 0 \cdot x^6 + 1 \cdot x^5 + 1 \cdot x^4 + 1 \cdot x^3 + 1 \cdot x^2 + 0 \cdot x + 1)^{64}$. For demonstration of this equation, reference may be made to the book *Information Theory and Reliable Communication*, by R. G. Gallager, published in 1968 by John Wiley & Sons, Inc., particularly page 235, bottom column.

As will be apparent from the foregoing, upon consecutive supply of data bits 1, 0, 1, 1 and 1, 1, 0, 1 through the lines 2-1 – 2-4, a bit pattern corresponding to a set of the coefficients of the remainder polynomial obtained by the division of $(1 \cdot x^7 + 0 \cdot x^6 + 1 \cdot x^5 + 1 \cdot x^4 + 1 \cdot x^3 + 1 \cdot x^2 + 0 \cdot x + 1)^{64}$ by $g(x) = x^8 + x^4 + x^3 + x^2 + 1$ is stored in the division circuit 5.

Further, when such an operation is continued until data bits 0, $r_1, r_2, \ldots$ and $r_{255}$ have all been fed successively in groups of 4 bits, the code-polynomial division circuit 5 holds therein a bit pattern corresponding to a set of the coefficients of the remainder polynomial obtained by dividing the polynomial $0 \cdot (x^{64})^{255} + r_1(x^{64})^{254} + r_2(x^{64})^{253} + \ldots + r_{255} = (r_1x^{254} + r_2x^{253} + \ldots + r_{255})^{64}$ by $g(x) = x^8 + x^4 + x^3 + x^2 + 1$. To generalize, at the instant after received data bits 0, 0, $\ldots$, 0, $r_1, r_2, \ldots$ and $r_N$ (including $d$ dummy bits 0) were fed in parallel in groups of $u$ bits to the division circuit 5 in a period of time of $(N+d)/u$ clocks, a bit train stored in the division circuit 5 of FIG. 1 corresponds to the coefficients of the remainder polynomial obtained when $(r_1x^{N-1} + r_2x^{N-2} + \ldots r_{N-1}x + r_N)^{u^*}$, $u \cdot u^* = 1 \pmod{N}$ is divided by $g(x)$.

Now, if the received code contains no erroneous bits, the remainder in the division of the polynomial $r_1x^{N-1} + r_2x^{N-2} + \ldots + r_{N-1}x + r_N$ by $g(x)$ must be 0, as stated previously. This means that whether the received code is correct or not can be determined by examining the contents of the code-polynomial division circuit 5 or checking whether or not all the bits stored therein are "0."

Suppose next that bit $r_i$, i.e., the $(d+i)$th bit of the transmitted data as counted with $d$ dummy bits at the code head included is received erroneously as its inversion $(r_i \oplus 1)$ owing to some disturbance or other on the transmission line. Then, as in the case previously described, a bit pattern corresponding to a set of the coefficients of the remainder polynomial obtained in the division by $g(x)$ of $(r_1x^{N-1} + r_2x^{N-2} + \ldots + (r_i \oplus 1)x^{N-i} + \ldots + r_{N-1}x + + r_N)^{u^*} = (r_1x^{N-1} + r_2x^{N-2} + \ldots + r_ix^{N-i} + \ldots + r_{N-1}x + r_N)^{u^*} + (x^{N-i})^{u^*}$ forms the contents of the division circuit 5. Consequently, the contents of the circuit 5 becomes equal to a set of the coefficients of the remainder polynomial made when $(x^{N-i})^{u^*}$ is divided by $g(x)$. Then, once it has been detected that the result obtained in the division circuit 5 is equal to the bit pattern corresponding to a set of the coefficients of the remainder polynomial obtained by the division of the $(x^{N-i})^{u^*}$ by $g(x)$, it is only necessary to correct the $(d+i)$th bit of the received data. For this error correction, however, since the received data are sent out by groups of $u$ bits from the buffer registers 9-1 – 9-u, it is necessary to check the data bits by groups of $u$ bits in order to detect any erroneous bit possibly included in each group of $u$ bits. Accordingly, the remainder of $m$ bits held as calculated in the division circuit 5 at the time when all of the received data bits 0, 0, $\ldots$, 0, $r_1, r_2, \ldots$ and $r_N$ including $d$ dummy bits "0" have been fed in parallel by groups of $u$ bits to the circuit 5, is directed through lines 6-1 – 6-m to a bit-pattern detector 7 (see FIG. 1). The detector 7 is comprised of $u$ bit-pattern detector units provided to decide whether or not the remainder bit pattern entering the detector 7 is equal to the bit-pattern corresponding to a set of the coefficients of the remainder polynomial obtained when $(x^{N-(1-d)})^{u^*}, (x^{N-(2-d)})^{u^*}, \ldots, (x^{N-(u-d)})^{u^*}$ are each divided by the generator polynomial $g(x)$. In this operation, output pulses given from the detector units and produced when the equality between the bit patterns compared is recognized, are sent through respective output lines 10-1, 10-2, $\ldots$ and 10-$u$ to addition circuits 11-1, 11-2, $\ldots$ and 11-$u$ of modulo 2, where bits fed through the respective buffer registers 9-1, 9-2, $\ldots$ and 9-$u$ are inverted so that the received erroneous bit is corrected.

It will be apparent from the foregoing that, by means of such a bit-pattern detection, the bits $r_1, r_2, \ldots$ and $r_{u-d}$ included in the leading $u$ bits of the received data 0, 0, ..., 0, $r_1$, $r_2$, ... and $r_{u-d}$ are properly dealt with for error correction.

It will further be recognized that, at the next clock, a next group of u bits of the received data including $r_{(u+1)-d}$, $r_{(u+2)-d}$, ... and $r_{2u-d}$, is properly corrected.

At the first, it is to be noted that in this clock period all the input bits fed to the division circuit 5 are "0" with all the switches 1-1 – 1-u connected to the respective null input lines. Therefore, the detector is fed by the division circuit with a bit pattern corresponding to a set of the coefficients of the remainder polynomial obtained by division by the generator polynomial $g(x)$ of $x^{uu^*}$ times the remainder polynomial calculated at the preceding clock or, in other words, when all the data have been received. At the bit-pattern detector 7, whether such a bit pattern corresponds to each of the sets of the coefficients of the respective remainder polynomials obtained when $(x^{N-(1-d)})^{u^*}$, $(x^{N-(2-d)})^{u^*}$, ..., $(x^{N-(u-d)})^{u^*}$ are divided by the generator polynomial $g(x)$ is checked. This is nothing but to check whether the bit pattern corresponding to a set of the coefficients of the remainder polynomial obtained in the division circuit 5 at the time of the reception of all the received data is equal to each of the sets of the coefficients of the respective remainder polynomials obtained by the division of $(x^{N-(1-d)})^{u^*} \cdot x^{-uu^*}$, $(x^{N-(2-d)})^{u^*} \cdot x^{-uu^*}$, ..., $(x^{N-(u-d)})^{u^*} \cdot x^{-uu^*}$, or $(x^{N-(u+1-d)})^{U^*}$, $(x^{N-(u+2-d)})^{u^*}$, ..., $(x^{N-(2u-d)})^{u^*}$ by $g(x)$.

Thus, whether the received data bits $r_{(u+1)-d}$, $r_{(u+2)-d}$ ... and $r_{2u-d}$ are correct or not is checked and their correction is effected at the addition circuits 11-1 – 11-u of modulo 2, as soon as the bits are supplied thereto through the respective buffer registers 9-1 – 9-u.

At the next clock, another set of u bits, $r_{(2u+1)-d}$, $r_{(2u+2)-d}$, ... and $r_{3u-d}$ of the received data are checked and corrected in the same manner. It will be apparent that further sets of u bits are properly corrected successively in the same fashion.

Next, the construction of the bit-pattern detector 7 will be described in detail with reference to FIG. 3, which shows a bit-pattern detector designed to effect 4-bit parallel processing for a cyclic code of the generator polynomial $g(x) = x^8 + x^4 + x^3 + x^2 + 1$. In this case, it is to be noted that the code length $N = 2^8 - 1 = 255$ and the number of dummy bits $d = 1$.

Now, the remainder obtained in the division of $(x^{N+d-1})^{u^*} = (x^{255-(1-1)})^{64}$ by $g(x)$ is $1 + 0 \cdot x + 0 \cdot x^2 + 0 \cdot x^3 + 0 \cdot x^4 + 0 \cdot x^5 + 0 \cdot x^6 + 0 \cdot x^7$, the remainder left after the division of $(x^{N+d-2})^{u^*} = (x^{255-(2-1)})^{64}$ by the $g(x)$ is $1 + 0 \cdot x + 0 \cdot x^2 + 0 \cdot x^3 + 0 \cdot x^4 + 0 \cdot x^5 + 1 \cdot x^6 + 0 \cdot x^7$, the remainder left after the division of $(x^{N+d-3})u^* = (x^{255-(3-1)})^{64}$ by $g(x)$ is $0 + 0 \cdot x + 1 \cdot x^2 + 1 \cdot x^3 + 0 \cdot x^4 + 0 \cdot x^5 + 1 \cdot x^6 + 1 \cdot x^7$ and the remainder left after the division of $(x^{N+d-4})^{u^*} = (x^{255-(4-1)})^{64}$ by $g(x)$ is $1 + 0 \cdot x + 0 \cdot x^2 + 0 \cdot x^3 + 0 \cdot x^4 + 1 \cdot x^5 + 0 \cdot x^6 + 1 \cdot x^7$. Consequently, in this case, there exist four bit patterns to be detected, i.e., (10000000), (10000010), (00110011) and (10000101).

Figure 3:
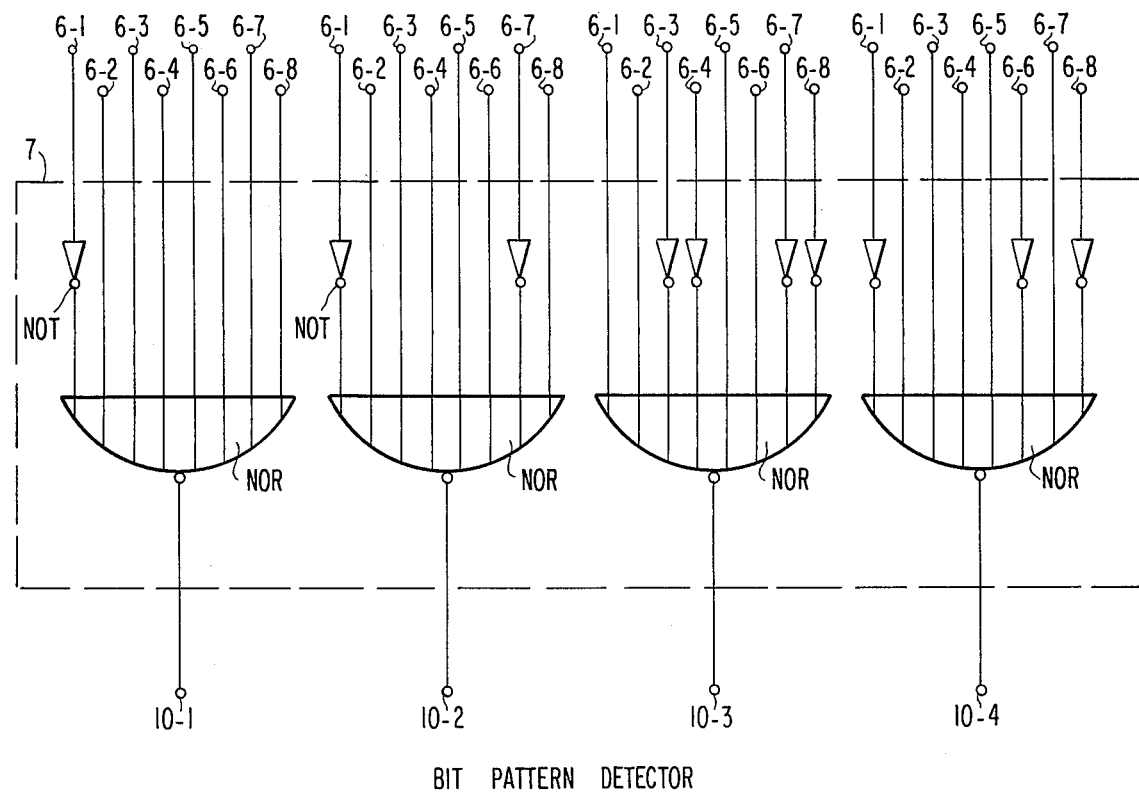
FIG. 3 shows a diagram of a bit-pattern detector of FIG. 1 in detail.

As will be readily noted, the bit-pattern detector 7 can be formed, for example, by the use of NOT and NOR ligic circuits as illustrated in FIG. 3.

Now, in the above illustration, if 0000010 ... 0 (256 bits) is received when 000 ... 0 (256 bits) is to be received, the contents of the registers $R_0 - R_7$ of the division circuit 5 at the time when all the bits have been received will take the form of a bit pattern 0, 1, 1, 1, 0, 1, 0, 1 corresponding to a set of the coefficients of the remainder polynomial obtained by the division of $x^{250}$ by $g(x) = x^8 + x^4 + x^3 + x^2 + 1$. This bit pattern is changed upon the next clock to 1, 0, 0, 0, 0, 0, 1, 0, and an error pulse is applied from the detector 7 through the output line 10-2 to the associated addition circuit 11-2 of modulo 2 for error correction. In case any other bit is erroneous, it will be obvious that it is detected and corrected in quite the same manner.

As will be apparent from the foregoing, the number of gates (addition circuits of modulo 2) required in the division circuit 5 between any two registers, for example, $R_2$ and $R_3$, is at most two including a gate interconnecting the associated shift line and a feedback line and another gate interconnecting the shift line and one of the input lines 4-1 – 4-m, and is independent of the generator polynomial $g(x)$ as well as of the number of parallel input bits or lines u.

The present cyclic-code parallel-processing system described above can operate effectively even where the number of parallel input bits u id changed, simply by operation of the switches 1-1 – 1-u and 8-1 – 8-(u-1), as will be illustrated below.

Assuming that u is equal to four in FIG. 1, the 4-bit parallel processing can be readily converted into one for 2-bit parallel processing as follows: As mentioned before, each switch 1-i (i=1 to 4) is provided to select the input line for data $r'i$ as the earth line. In this case, both the switches 1-1 and 1-3 select the earth line, and the switch 1-1 is connected with the line 2-1 and the switch 1-3 with the line 2-3. On the other hand, the switches 1-2 and 1-4 connected with the lines 2-2 and 2-4 are left connected with the respective input lines $r'_2$ and $r'_4$ so that data bits are fed through the two input lines in parallel or in groups of two bits. In order to store the data bits given through the selected input lines $r'_2$ and $r'_4$, the buffer registers associated with the respective lines should have a length increased to twice (4/2 = 2) the length required for 4-bit parallel input. To this end, the second switch 8-3 is closed to connect the buffer registers 9-3 and 9-4 in series with each other so that data bits entering through the input line $r'_4$ may be stored successively first in the buffer register 9-4 and then in the buffer register 9-3 and the bits thus stored are sent out from the latter register 9-3 in succession.

Similarly, the second switch 8-1 is closed so that data bits entering through the input line $r'_2$ may be successively stored first in the buffer register 9-2 and then in the register 9-1 and sent out from the latter register 9-1.

At this time point, it will be noted that in the combination logic circuit 3 of FIG. 2, a bit pattern is calculated, which corresponds to the remainder polynomial obtained when the polynomial $r'_4 + 0 \cdot x^{64} + r'_2(x^{64})^2 + 0 \cdot (x^{64^3} = r'_4 + r'_2 x^{128}$ is divided by the generator polynomial $g(x) = x^8 + x^4 + x^3 + x^2 + 1$ and, because of $2 \cdot 128 = 1 \pmod{255}$, it is noted that the logic circuit 3 is now nothing but that for 2-bit parallel processing.

It follows, therefore, that, at the point of time when all the data bits 0, $r_1$, $r_2$, ..., $r_{255}$ have been received, the contents of the division circuit 5 are in the form of a bit pattern corresponding to the coefficients of the remainder polynomial obtained by dividing $(r_1 x^{254} + r_2 x^{253} + ... + r_{255})^{128}$ by the generator polynomial $g(x) = x^8 + x^4 + x^3 + x^2 + 1$.

Therefore, whether the received code is correct or not can be determined by checking whether such a bit pattern stored in the division circuit consists only of bits of "0," as in the case of 4-bit parallel processing.

Moreover, the bit patterns employed for bit error correction are those two which correspond to the respective sets of the coefficients of the remainder polynomials respectively obtained when $(x^{255-(1-1)})^{128}$ and $(x^{255-(2-1)})^{128}$ are didided by $g(x) = x^8 + x^4 + x^3 + x^2 + 1$. In other words, in this case, there are two bit patterns to be detected which are determined as (10000000) and (00110011), respectively, since the remainder left after the division of $(x^{255-(1-1)})128$ by $g(x)$ is $1 + 0 \cdot x + 0 \cdot x^2 + 0 \cdot x^3 + 0 \cdot x^4 + 0 \cdot x^5 + 0 \cdot x^6 + 0 \cdot x^7$ and that left after the division of $(x^{255-(2-1)})128$ by $g(x)$ is $0 + 0 \cdot x + 1 \cdot x^2 + 1 \cdot x^3 + 0 \cdot x^4 + 0 \cdot x^5 + 1 \cdot x^6 + 1 \cdot x^7$. Detector units for the two bit patterns are included in the bit-pattern detector 7 of FIG. 3 and produce respective output pulses for the two bit patterns through the output lines 10-1 and 10-3, respectively. It will now be recognized that, with the switches 8-1 and 8-3 positioned as described previously, received data bits as sent from the buffer register 9-1 and 9-3 are properly corrected in the respective addition circuits 11-1 and 11-3 of modulo 2 on the basis of the detector output pulses.

Incidentally, if, in FIG. 1, the switches 1-1 – 1-(u-1) are held connected with the null input lines and the switches 8-1 – 8-(u-1) are kept connected with the respective output lines of the buffer registers 9-2 – 9-u, so that data bits are serially fed through a single input line $r'_u$, the parallel-processing circuit illustrated serves as an error correcting circuit dealing with the cyclic code in a serial fashion for error correction.

It will be readily appreciated from the foregoing that the present invention has the features that it includes, in a system for parallel processing of a cyclic code, a code-polynomial division circuit with a minimized number of gates arranged between the registers used therein and that it has such an adaptability that, even where the number of parallel input bits is changed, the present system can operate effectively as one for the new number of parallel bits just by properly operating the switches included in the system.

The cyclic-code parallel processing system of the present invention has been described herein as one principally intended to correct any single random error in the N bits of the received cyclic code, but it will be apparent to those skilled in the art that in view of the nature of the cyclic code the principles of the present invention can also be utilized to realize a system for correction of random errors of multiple bits or burst errors.

What is claimed is:

1. A parallel-processing error correction system for a data transmission system employing a cyclic error correcting code comprising:
    a plurality of data input lines;
    a plurality of null input lines;
    a plurality of first switches, each having first and second inputs connected respectively to said data input lines and said null input lines, and having outputs;
    a plurality of second switches, each having first and second inputs and an output, the first inputs of said second switches being connected to corresponding first switch outputs;
    a plurality of serial buffer registers having inputs connected to said second switch output lines for storing a bit train fed in parallel therethrough, and having outputs connected to each of said second switches second inputs;
    a combination logic circuit for converting said bit train into bit patterns of a length determined depending on the number of redundant bits in the code employed having inputs and outputs, said inputs of said combination logic circuit being connected to said first switch output lines;
    a code-polynomial division circuit employing a parallel-input serial-feedback shift register having inputs connected to said combination logic circuit outputs, and having outputs;
    a bit pattern detector having inputs connected to said code-polynomial division circuit outputs for detecting particular bit patterns out of the output of the division circuit, and having outputs;
    a correcting circuit connected to said buffer register outputs and to said bit-pattern detector outputs for correcting the bit sequence read out in parallel with the buffer registers in synchronism with the output of said detector;
    wherein said first switches are operable to selectively connect either one of the data input lines or one of said null input lines to the combination circuit; and
    said second switches are each operable to selectively connect either one of the output lines from the first switches or one of the output lines of the buffer registers to said switch output line;
    whereby the system is effectively operable even where the number of parallel input bits are changed simply by the operation of the first and second switches depending upon the change in the number of parallel input bits.

2. The apparatus of claim 1 wherein each of said second switches has its second input connected to the output of the buffer register next to the buffer register connected to said second switch output.

3. The apparatus of claim 1 wherein said code-polynomial division circuit comprises series connected one step shift registers and exclusive "OR" gates wherein
    said exclusive OR gates have outputs connected to the inputs of said shift registers and have selected inputs connected to said combination logic circuit outputs and
    wherein the output of said code-polynomial division circuit is connected to selected exclusive "OR" gate inputs.

4. The apparatus of claim 1 wherein said bit-pattern detector is formed by the use of NOT and NOR logic circuits 5. A parallel-processing error correction system for a data transmission system employing a cyclic error correcting code comprising:
    a plurality of input lines;
    a plurality of serial buffer registers having inputs connected to said respective input lines for storing a bit train fed in parallel therethrough, and having outputs;
    a combination logic circuit for converting said bit train into bit patterns of a length determined depending on the number of redundant bits in the code employed having inputs and outputs, said inputs of said combination logic circuit being connected to said input lines;
    a code-polynomial division circuit employing a parallel-input serial-feedback shift register having inputs connected to said combination logic circuit outputs and having outputs;
    a bit-pattern detector having inputs connected to said code-polynomial division circuit outputs for detecting particular bit patterns out of the output of the division circuit, and having outputs;

a correcting circuit connected to said buffer register outputs and to said bit-pattern detector outputs for correcting the bit sequence read out in parallel from the buffer registers in synchronism with the output of said detector;

wherein said code-polynomial division circuit comprises series connected one step shift registers and exclusive "OR" gates wherein said exclusive OR gates have outputs connected to the inputs of said shift registers and have selected inputs connected to said combination logic circuit outputs and wherein the output of said code-polynomial division circuit is connected to selected exclusive "OR" gate inputs.

6. A parallel-processing error correction system for a data transmission system employing a cyclic error correcting code comprising:

a plurality of input lines;

a plurality of serial buffer registers having inputs connected to said respective input lines for storing a bit train fed in parallel therethrough, and having outputs;

a combination logic circuit for converting said bit train into bit patterns of a length determined depending on the number of redundant bits in the code employed having inputs and outputs, said inputs of said combination logic circuit being connected to said input lines;

a code-polynomial division circuit employing a parallel-input serial-feedback shift register having inputs connected to said combination logic circuit outputs and having outputs;

a bit-pattern detector having inputs connected to said code-polynomial division circuit outputs for detecting particular bit patterns out of the output of the division circuit, and having outputs;

a correcting circuit connected to said buffer register outputs and to said bit-pattern detector outputs for correcting the bit sequence read out in parallel from the buffer registers in synchronism with the output of said detector; and wherein said bit-pattern detector is formed by the use of NOT and NOR logic circuits.

* * * * *

UNITED STATES PATENT AND TRADEMARK OFFICE
CERTIFICATE OF CORRECTION

PATENT NO. : 4,105,999

DATED : August 8, 1978

INVENTOR(S) : Katsuhiro NAKAMURA

It is certified that error appears in the above-identified patent and that said Letters Patent are hereby corrected as shown below:

IN THE SPECIFICATION:

Column 2, line 34 - delete ". Thus," insert -- because -- line 35 - after "patent" insert -- No. 3,452,328 -- line 43 - delete "encloded" insert -- encoded --

Column 5, line 4 - after "such" delete "as" insert -- an -- line 48 - delete "30" insert -- + --

Column 7, line 27 - delete "$(x^{N-(u+1-d)})^{U*}$"

insert -- $(x^{N-(u+1-d)})_{u*}$ --

UNITED STATES PATENT AND TRADEMARK OFFICE
CERTIFICATE OF CORRECTION

PATENT NO. : 4,105,999
DATED : August 8, 1978
INVENTOR(S) : Katsuhiro NAKAMURA

It is certified that error appears in the above-identified patent and that said Letters Patent are hereby corrected as shown below:

Column 7, line 51 - delete "$(x^{N+d-3})u^*$" insert -- $(x^{N+d-3})u^*$ -- line 63 - delete "$R_{0-R7}$" insert -- $R_0 - R_7$ --

Column 8, line 51 - delete "$0.(x^{643}$" insert -- $0.(x^{64})^3$ --

Column 9, line 6 - delete "$(x^{255-(1-1)})128$"

insert -- $(x^{255-(1-1)})128$ --

Signed and Sealed this

Twentieth Day of March 1979

[SEAL]

Attest:

RUTH C. MASON
Attesting Officer

DONALD W. BANNER
Commissioner of Patents and Trademarks